United States Patent
Sugiyama et al.

(10) Patent No.: US 9,050,538 B2
(45) Date of Patent: Jun. 9, 2015

(54) COLLISION DETECTION AND MOTION SIMULATION IN GAME VIRTUAL SPACE

(75) Inventors: Hajime Sugiyama, Kanagawa (JP); Hitoshi Ishikawa, Tokyo (JP); Chihiro Kanno, Kanagawa (JP); Tomohisa Kano, Tokyo (JP)

(73) Assignees: Sony Corporation, Tokyo (JP); Sony Corporation Entertainment Inc., Tokyo (JP)

( * ) Notice: Subject to any disclaimer, the term of this patent is extended or adjusted under 35 U.S.C. 154(b) by 353 days.

(21) Appl. No.: 13/438,262

(22) Filed: Apr. 3, 2012

(65) Prior Publication Data
US 2012/0303343 A1 Nov. 29, 2012

(30) Foreign Application Priority Data

| May 26, 2011 | (JP) | 2011-118455 |
| May 26, 2011 | (JP) | 2011-118456 |
| May 26, 2011 | (JP) | 2011-118457 |
| May 26, 2011 | (JP) | 2011-118458 |

(51) Int. Cl.
| *A63F 13/577* | (2014.01) |
| *G06T 13/20* | (2011.01) |
| *G06N 3/00* | (2006.01) |
| *G06F 17/50* | (2006.01) |

(52) U.S. Cl.
CPC ......... *A63F 13/577* (2014.09); *A63F 2300/643* (2013.01); *G06F 17/5009* (2013.01); *A63F 2300/6607* (2013.01); *G06N 3/006* (2013.01); *G06T 13/20* (2013.01); *G06T 2210/21* (2013.01)

(58) Field of Classification Search
CPC .................................................. A63F 13/577
See application file for complete search history.

(56) References Cited

U.S. PATENT DOCUMENTS

| 6,057,859 | A * | 5/2000 | Handelman et al. ........... 345/474 |
| 7,281,981 | B2 * | 10/2007 | Yotoriyama .................. 345/419 |
| 7,403,202 | B1 | 7/2008 | Nash |
| 2010/0331090 | A1 | 12/2010 | Dohta |

FOREIGN PATENT DOCUMENTS

| EP | 02098997 A | 9/2009 |
| JP | 2001243495 A | 9/2001 |
| JP | 2001-321562 A | 11/2001 |
| JP | 2004321551 A | 11/2004 |
| JP | 2011028714 A | 2/2011 |
| JP | 2011-045623 A | 3/2011 |

OTHER PUBLICATIONS

Office Action for corresponding Japanese Patent Application No. 2011-118458, dated Oct. 1, 2013.
Office Action for corresponding Japanese Patent Application No. 2011-118456, dated May 7, 2013.
(Continued)

*Primary Examiner* — Kamini S Shah
*Assistant Examiner* — Jay B Hann
(74) *Attorney, Agent, or Firm* — Matthew B. Dernier, Esq.; Gibson & Dernier LLP

(57) ABSTRACT

An object placement managing unit (44) controls whether or not to change the position or direction of a first object according to a positional relationship between a passive area determined based on the position of the first object, and a judging area determined based on the position of a second object. The object placement managing unit (44) controls whether or not to change the position or direction of the second object according to a positional relationship between an active area determined based on the position of the first object and differing from the passive area, and the judging area.

7 Claims, 9 Drawing Sheets

(56) References Cited

OTHER PUBLICATIONS

Office Action for corresponding Japanese Patent Application No. 2011-118458, dated Jun. 4, 2013.

Office Action for corresponding Japanese Patent Application No. 2011-118455, dated Jan. 6, 2015.

Office Action for corresponding Japanese Patent Application No. 2011-118457, dated Jun. 4, 2013.

* cited by examiner

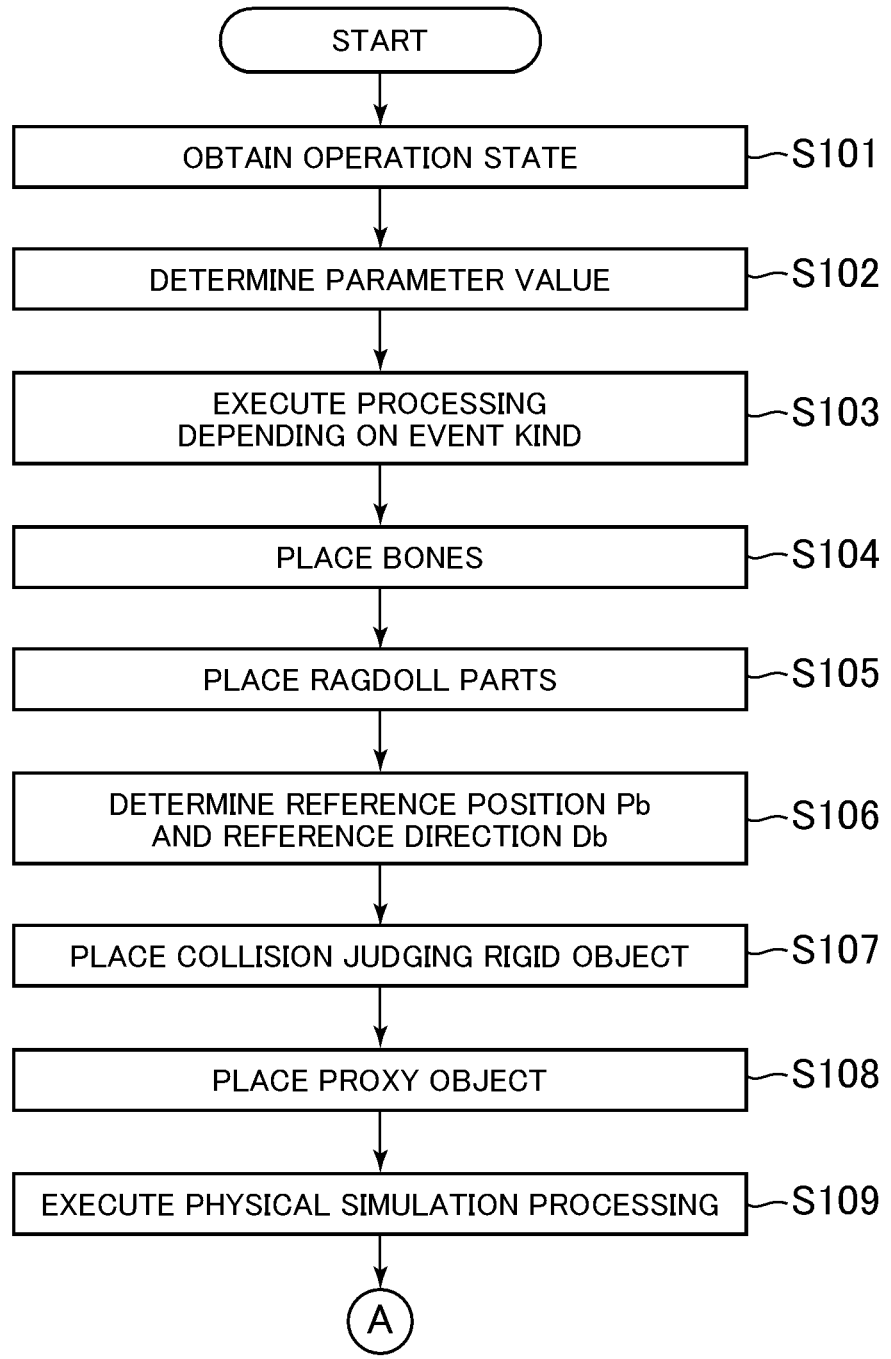

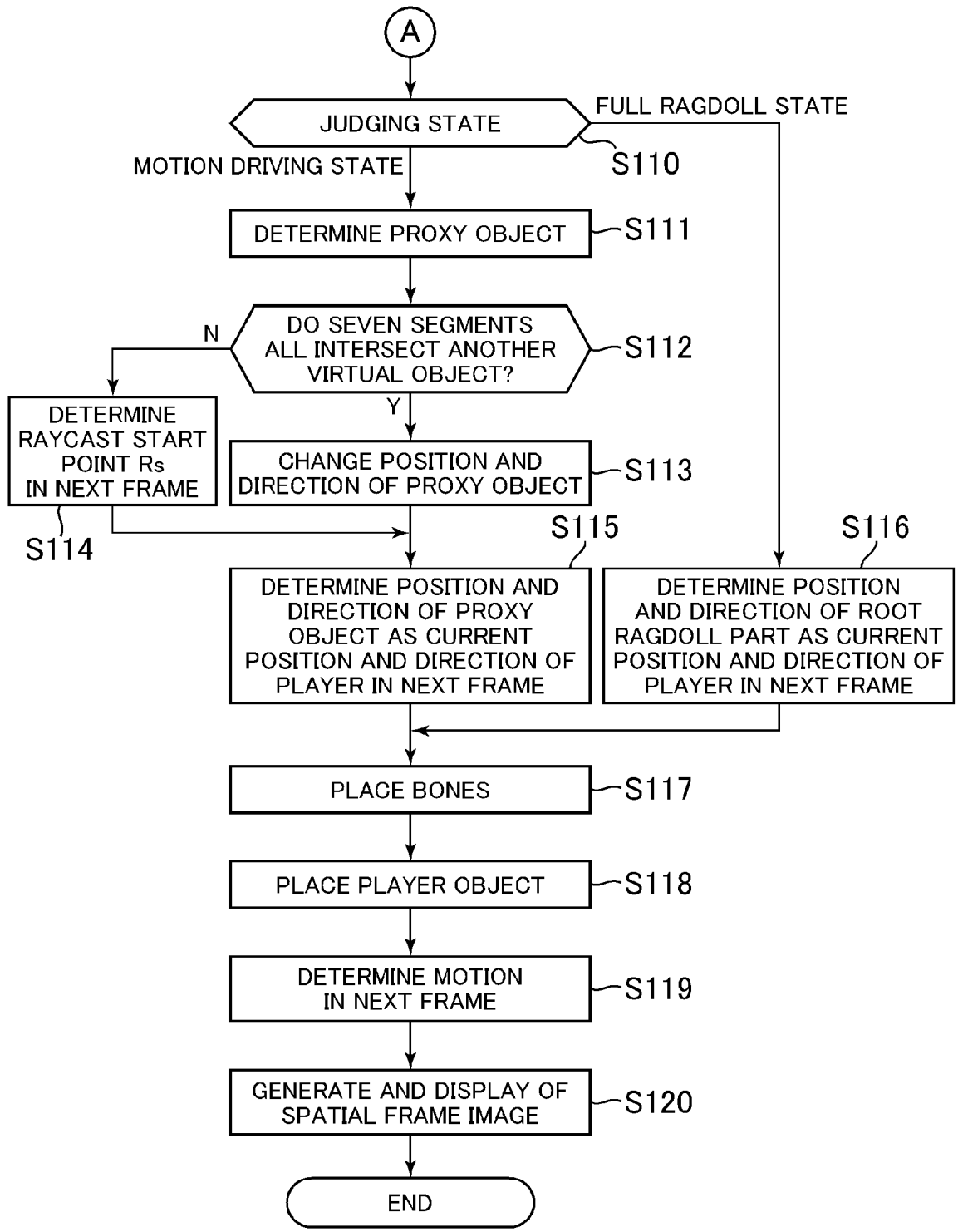

ature of a moving velocity and displacement of a collision partner (referred to as active physical quantity here). Further, an active area for judging whether or not to change at least one of the position and the direction of a collision partner and a passive area for judging whether or not to change at least one of the position and the direction of its own may be separately set. In the above, under a condition that a judging area set for the collision partner overlaps with the active area, at least one of the moving velocity and displacement of the collision partner may be determined based on the active physical quantity, and under a condition that the judging area overlaps with the passive area, at least one of the moving velocity and displacement of its own may be determined based on the passive physical quantity. With the above, a calculated result by the physics engine is stabilized, and the collision partner object will not move more largely than expected.

Note that a situation in which separate setting of the active and passive areas can reduce possibility of lessening reality in expression of a picture in which objects placed in a virtual space collide against each other is not limited to the above described situation.

The present invention has been conceived in view of the above, and one of the objects of some embodiments of the present invention is to reduce possibility of lessening reality in expression by an information processing system, of a picture in which objects placed in a virtual space collide against each other.

In order to achieve the above described object, according to one aspect of the present invention, there is provided a program stored in a non-transitory computer readable information storage medium, for causing a computer to function as an information processing system for simulating a collision between objects placed in a virtual space, the program including: first control instructions to control whether or not to change at least one of a position and a direction of a first object according to a positional relationship between a passive area determined based on the position of the first object and a judging area determined based on a position of a second object; and second control instructions to control whether or not to change at least one of a position and a direction of the second object according to a positional relationship between an active area determined based on the position of the first object and differing from the passive area, and the judging area.

According to another aspect of the present invention, there is provided a non-transitory computer readable information storage medium storing a program for causing a computer to function as an information processing system for simulating a collision between objects placed in a virtual space, the program including: first control instructions to control whether or not to change at least one of a position and a direction of a first object according to a positional relationship between a passive area determined based on the position of the first object and a judging area determined based on a position of a second object; and second control instructions to control whether or not to change at least one of a position and a direction of the second object according to a positional relationship between an active area determined based on the position of the first object and differing from the passive area, and the judging area.

According to one aspect of the present invention, there is provided an information processing system for assisting expression of a situation in which objects placed in a virtual space collide against each other, comprising: a first control unit for controlling whether or not to change at least one of a position and a direction of a first object according to a positional relationship between a passive area determined based

COLLISION DETECTION AND MOTION SIMULATION IN GAME VIRTUAL SPACE

CROSS-REFERENCE TO RELATED APPLICATIONS

The present application claims priority from Japanese application JP 2011-118455, JP 2011-118456, JP 2011-118457, and JP 2011-118458, all filed on May 26, 2011, the content of which is hereby incorporated by reference into this application.

BACKGROUND OF THE INVENTION

1. Field of the Invention

The present invention relates to a program, an information storage medium, an information processing system, and an information processing method.

2. Description of Related Art

There has been available an information processing system that sequentially generates frame images each showing a picture obtained by viewing an object placed in a virtual space from a viewpoint position defined in the virtual space in the viewing direction, and displays on a display device. There has also been available an image processing system that utilizes a physics engine, which is a software for simulating the laws of physics, such as the laws of classical mechanics, to improve reality in movement of an object placed in a virtual space.

Generally, the physics engine determines a position and an direction of an object after elapse of a predetermined period of time, based on a value of a parameter indicative of physical quantity (e.g., position, direction, mass, inertia moment, velocity, angular velocity) set for each object at a certain moment and a value of a parameter indicative of physical quantity (e.g., wind velocity) relating to the whole virtual space.

SUMMARY OF THE INVENTION

In simulation by a physics engine, of a collision between objects placed in a virtual space, under the condition that the ratio of values set as mass and that as inertia moment are large, the physics engine may provide a value very close to zero in the process of calculation of a change in the physical quantity of the respective objects (e.g. change in the velocity, angular velocity, displacement, rotation amount, and so forth). In this case, a calculated result by the physics engine may possibly become unstable due to influence of a round error. This may possibly result in an unrealistic expression of a picture in which objects placed in a virtual space collide against each other, showing, e.g., an object having a small value for mass penetrating an object having a large value for mass (e.g., a wall object) or colliding against an object having a large value for mass to be blown off more largely than expected.

In the above, it is expected that setting a larger value for mass and/or inertia moment of the object having a small value for mass and/or inertia moment can stabilize a calculated result by the physics engine. However, the possibility of an unrealistic expression of a picture in which objects placed in the virtual space collide against each other may remain after all, showing, e.g., a collision partner object moving more largely than expected.

To address the above, the value of physical quantity of its own that is a base in calculation of a moving velocity and displacement of its own (referred to as passive physical quantity here) may be set larger, while maintaining unchanged the value of physical quantity of its own that is a base in calcuon the position of the first object and a judging area determined based on a position of a second object; and a second control unit for controlling whether or not to change at least one of a position and a direction of the second object according to a positional relationship between an active area determined based on the position of the first object and differing from the passive area, and the judging area.

According to one aspect of the present invention, there is provided an information processing method for simulating a collision between objects placed in a virtual space collide against each other, the method comprising: controlling whether or not to change at least one of a position and a direction of a first object according to a positional relationship between a passive area determined based on the position of the first object and a judging area determined based on a position of a second object; and controlling whether or not to change at least one of a position and a direction of the second object according to a positional relationship between an active area determined based on the position of the first object and differing from the passive area, and the judging area.

According to the present invention, as the passive area, which is a base in control as to whether or not to change at least one of the position and the direction of the first object, is set separately from the active area, which is a base in control as to whether or not to change at least one of the position and the direction of the second object, it is possible to reduce possibility of lessening reality in expression by an information processing system, of a picture in which objects placed in a virtual space collide against each other.

According to one aspect of the present invention, the first control instructions include instructions to change at least one of the position and the direction of the first object under a condition that at least a part of the passive area overlaps with at least a part of the judging area, and the second control instructions include instructions to change at least one of the position and the direction of the second object under a condition that at least a part of the active area overlaps with at least a part of the judging area.

According to one aspect of the present invention, the first control instructions include instructions to change at least one of the position and the direction of the first object by an amount that is determined based on moving velocity information relating to a relationship between a moving velocity of the first object and a moving velocity of the second object when the first object collides against the second objects, passive physical quantity information having at least one of a value correlated to the mass and a value correlated to the inertia moment of the first object, and partner physical quantity information indicating physical quantity correlated to at least one of the mass and the inertia moment of the second object, in changing at least one of the position and direction of the first object, and the second control instructions include instructions to change at least one of the position and the direction of the second object by an amount that is determined based on active physical quantity information having at least one of a value correlated to the mass and a value correlated to the inertia moment of the first object and differing from the value of the passive physical quantity information, and the partner physical quantity information.

According to one aspect of the present invention, the program further includes setting instructions to set a value of the active physical quantity information according to attribute of the second object, and the second control instructions include instructions to change at least one of the position and the direction of the second object by an amount that is determined based on the active physical quantity information of which value is set by the setting instructions.

According to one aspect of the present invention, the program may further includes image generating instructions to generate an image showing a picture obtained by viewing the virtual space where the first object and the second object are placed from a viewpoint set in the virtual space.

BRIEF DESCRIPTION OF THE DRAWINGS

FIG. 6A is a flowchart of one example of a flow of processing executed for every frame in the game device according to one embodiment of the present invention;

FIG. 6B is a flowchart of one example of a flow of processing executed for every frame in the game device according to one embodiment of the present invention;

DETAILED DESCRIPTION OF THE INVENTION

In the following, one embodiment of the present invention will be described in detail with reference to the accompanying drawings.

Figure 1:
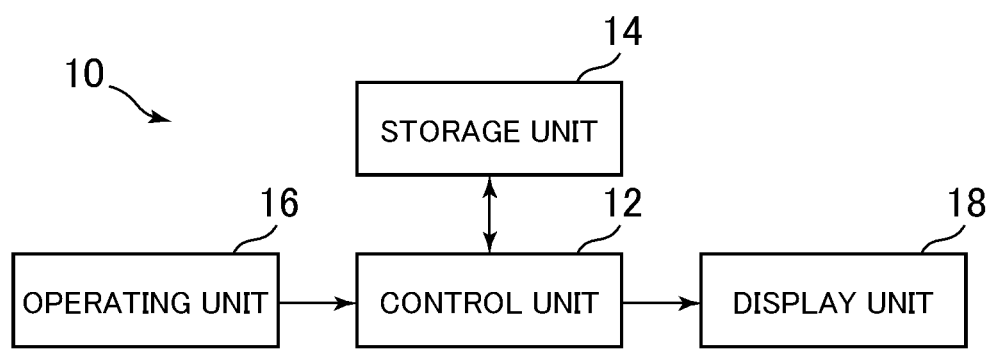
FIG. 1 is a diagram showing a structure of a game device according to an embodiment of the present invention.

FIG. 1 is a diagram showing a structure of a game device 10 that functions as an information processing system according to an embodiment of the present invention. The game device 10 according to this embodiment is, for example, a game console, a portable game terminal, and a personal computer. As shown in FIG. 1, the game device 10 according to this embodiment includes a control unit 12, a storage unit 14, an operating unit 16, and a display unit 18.

The control unit 12 is a program control device, such as a CPU (e.g., Central Processing Unit), that operates according to a program installed in the game device 10. The storage unit 14 is a storage device, such as a ROM (e.g., Read-Only Memory) or a RAM (e.g., Random Access Memory), or a hard disk drive. The operating unit 16 is a keyboard, a mouse, or a controller of a consumer game device, or the like, and upon receipt of input of a user operation, outputs a signal indicating the content of the user operation to the control unit 12. The display unit 18 is a display device, such as a liquid crystal display, and displays a variety of images according to an instruction from the control unit 12.

Note that the game device 10 may include a communication interface, such as a network board, an optical disc drive for reading an optical disc, such as a DVD-ROM (Digital Video Disc-Read Only Memory) or a Blu-ray (registered trademark) disk, and a USB (Universal Serial Bus) port.

Figure 2:
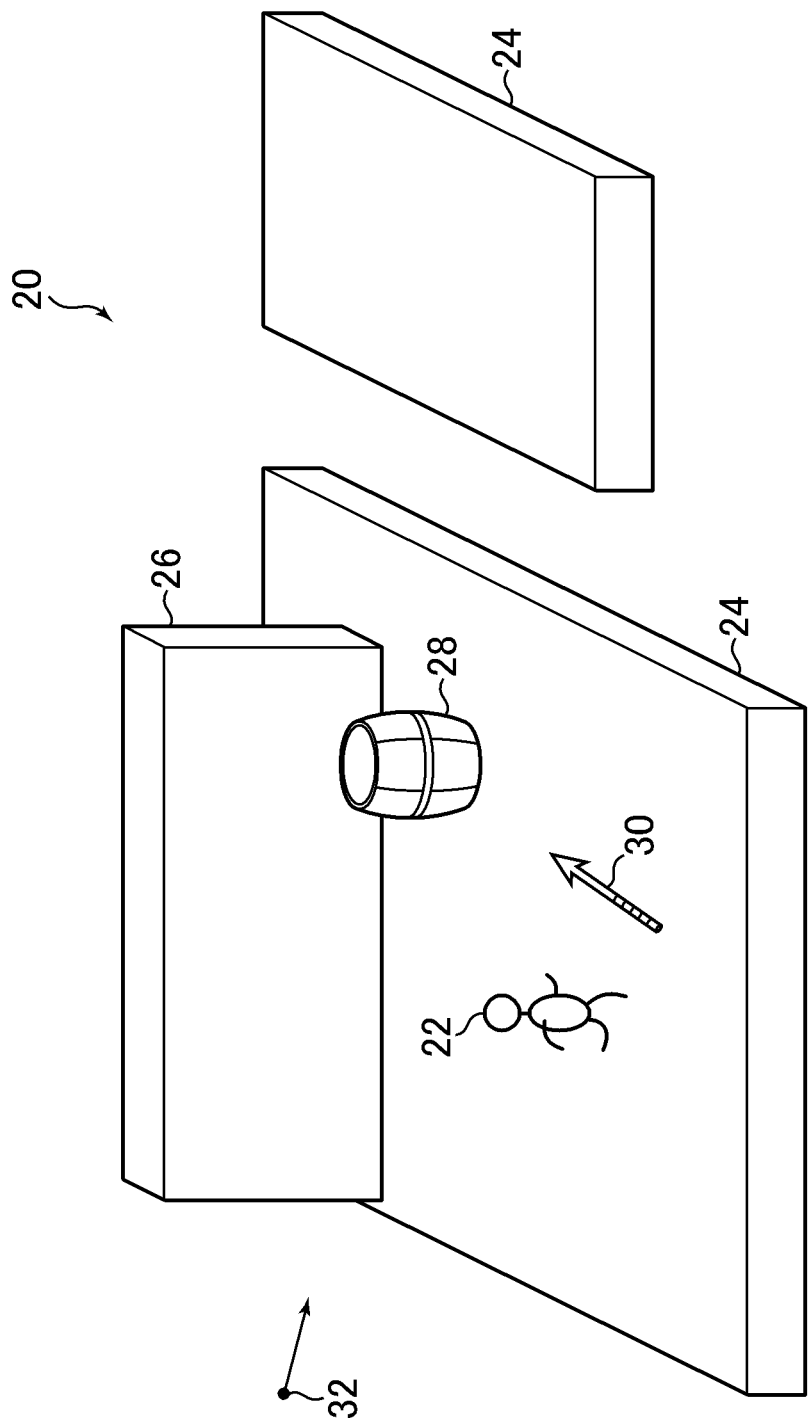
FIG. 2 is a diagram showing one example of a virtual space generated by the game device according to an embodiment of the present invention.

The game device 10 according to this embodiment executes a program to which the present invention is applied to thereby generate a virtual space 20 shown as an example in FIG. 2 in the memory. As shown, the virtual space 20 according to this embodiment is a virtual 3D space where virtual objects, such as a player object 22, a floor object 24, a wall object 26, a barrel object 28, a spear object 30, are placed as well as a viewpoint 32.

In this embodiment, a virtual object includes a plurality of polygons, each having a texture mapped thereon. In this embodiment, a user of the game device 10 can operate the operating unit 16 to thereby move the player object 22 in the virtual space 20.

In the program executed in the game device 10 according to this embodiment, the function of a physics engine for simulating the laws of physics, such as the laws of classical mechanics, is implemented.

Figure 3:
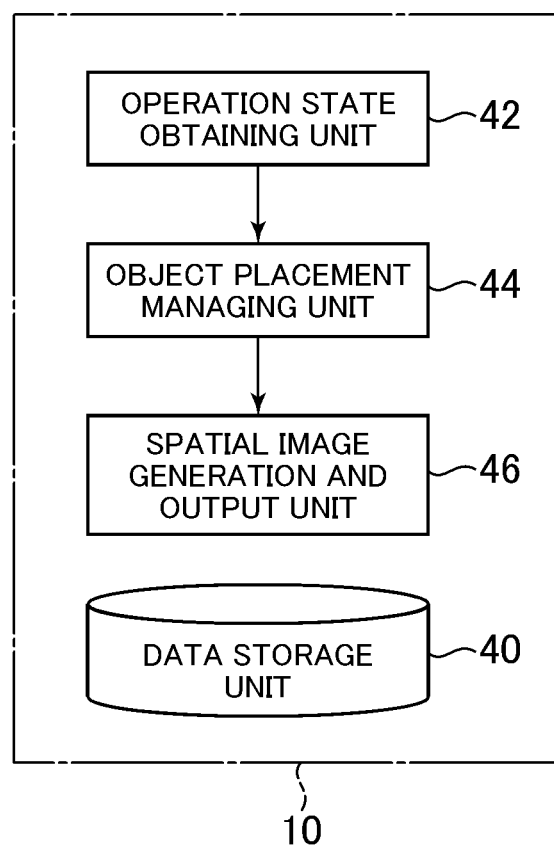
FIG. 3 is a functional block diagram showing one example of functions implemented in the game device according to an embodiment of the present invention.

FIG. 3 is a functional block diagram of the game device 10 according to this embodiment. As shown in FIG. 3, the game device 10 functionally comprises a data storage unit 40, an operation state obtaining unit 42, an object placement managing unit 44, and a spatial image generation and output unit 46. The data storage unit 40 is implemented mainly using the storage unit 14, while the other components are implemented mainly using the control unit 12.

These functions are achieved by executing a program according to this embodiment in the game device 10, or an information processing system. This program may be downloaded from another computer via a communication interface through a computer communication network or stored in a computer readable information storage medium, such as an optical disc (e.g., a CD-ROM (e.g., Compact Disc-Read-Only Memory) or a DVD ROM) or a USB memory, to be installed therefrom into the game device 10 via an optical disc drive, a USB (Universal Serial Bus) port, or the like.

In this embodiment, various data necessary for generating the virtual space 20 is stored in advance in the data storage unit 40. In the data storage unit 40, polygon data, texture data, and so forth, relating to a virtual object placed in the virtual space 20 are stored.

Figure 4:
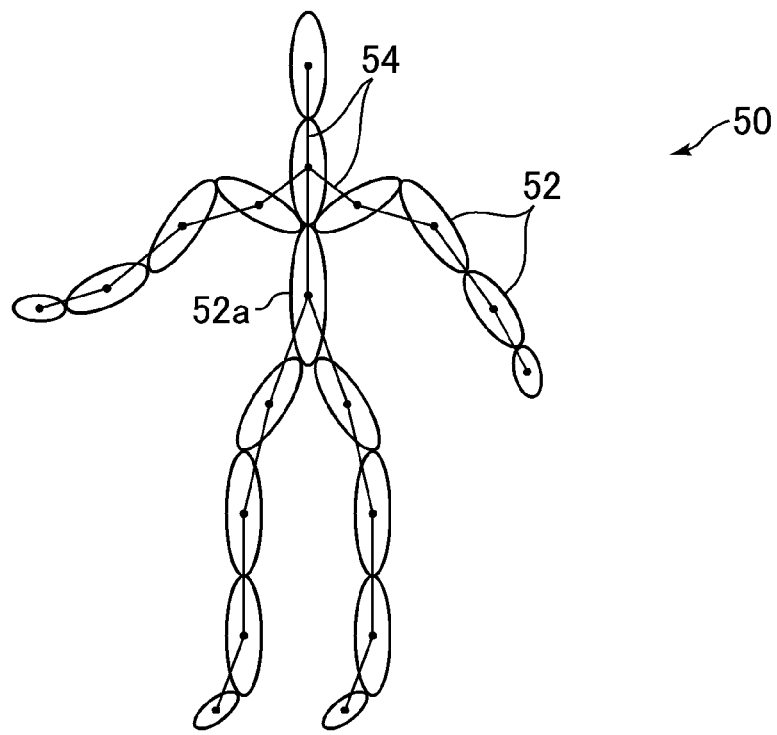
FIG. 4 is a diagram showing one example of skeleton data.

Further, in the data storage unit 40, skeleton data 50 representative of a virtual skeleton of the player object 22, such as is shown in, e.g., FIG. 4, is stored. The skeleton data 50 includes, e.g., a bone 52 corresponding to a node in a tree structure and a joint 54 corresponding to a link in the tree structure. That is, in this embodiment, the joint 54 connects the bones 52, and defines a parent-child relationship between the bones 52. Further, according to the skeleton data 50 according to this embodiment, a bone 52 correlated to, e.g., a body part is set as a root node in the tree structure. The bone 52 correlated to the body part is hereinafter referred to as a root bone 52a. In this embodiment, the posture of the player object 22 is uniquely determined based on the posture of the skeleton defined by a plurality of bones 52. Therefore, in this embodiment, once the positions of the respective bones 52 and the directions in which the respective bones 52 are directed (hereinafter simply referred to as a direction of the bone 52) are determined, it is possible to generate a polygon model of the player object 22 in conformity with the positions and directions of the respective bones 52. Note that, in this embodiment, the bone 52 and the joint 54 are invisible virtual objects.

Figure 5:
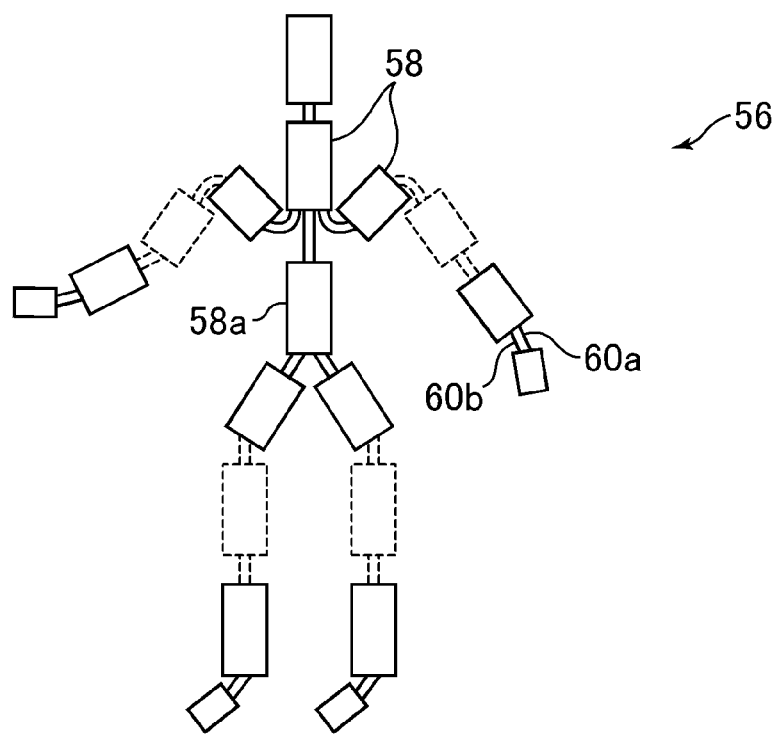
FIG. 5 is a diagram showing one example of ragdoll data.

In this embodiment, ragdoll data 56, shown as an example in FIG. 5, as well is stored in advance in the data storage unit 40. The ragdoll data 56 is data relating to a ragdoll, or an object to be subjected to a physical simulation processing by the physics engine. The ragdoll data 56 includes a ragdoll part 58 and a joint 60 for connecting the ragdoll parts 58. In this embodiment, two ragdoll parts 58 are connected by two joints 60 (a physical joint 60a and an animation joint 60b). In this embodiment, each ragdoll part 58 has a shape like, e.g., a column, a capsule, a sphere, or a combination thereof. Note that, in this embodiment, the ragdoll part 58 and the joint 60 are invisible virtual objects.

In the data storage unit 40, a value of a parameter indicative of physical quantity (e.g., size, mass, inertia moment (inertia tensor in this embodiment), extent of applying gravity, friction factor, extent of influence of wind, velocity, angular velocity, maximum velocity, maximum angular velocity, impulse value (value indicating an impulse), and so forth) of each ragdoll part 58 and a value indicative of a movement type of each ragdoll part 58 are stored. These values are changeable as the game proceeds. Note that a movement type of the ragdoll part 58 will be described later.

In this embodiment, in the data storage unit 40, a value of a parameter indicative of physical quantity (e.g., strain) correlated to a pair of joints 60 (a combination of the physical joint 60a and the animation joint 60b) for connecting the ragdoll parts 58 is also stored. These values are changeable as the game proceeds.

In this embodiment, in the data storage unit 40, a value of a parameter indicative of physical quantity relating to the whole virtual space 20 as well is stored. In the data storage unit 40, e.g., the value of a parameter indicative of a wind velocity at a position in the virtual space 20 is stored so as to be correlated to the position coordinates of the position. In this embodiment, the value of a parameter indicative of physical quantity relating to the whole virtual space 20 is changeable as time passes according to a predetermined rule.

In this embodiment, in the data storage unit 40, data describing a correlation relationship between the bone 52 and the ragdoll part 58 and data describing a correlation relationship between the joint 54 included in the skeleton data 50 and one pair of joints 60 included in the ragdoll data 56 are stored. As shown in FIG. 5, in this embodiment, the bone 52 may or may not be correlated to the ragdoll part 58. In the example shown in FIG. 5, no ragdoll part 58 is correlated to the bones 52 corresponding to the upper left arm, the upper right arm, the left thigh, and the right thigh, respectively. In this embodiment, the ragdoll part 58 correlated to the root bone 52a is referred to as a root ragdoll part 58a. In this embodiment, the ragdoll data 56 always includes the root ragdoll part 58a.

In this embodiment, as shown in FIG. 5, the joint 54 included in the skeleton data 50 may or may not be correlated to one pair of joints 60 included in the ragdoll data 56.

In this embodiment, in the data storage unit 40, transformation rule data describing a rule for transforming the skeleton data 50 into the ragdoll data 56 and inverse transformation rule data describing a rule for inversely transforming the ragdoll data 56 into the skeleton data 50 are stored in advance. In this embodiment, for example, while data describing a transformation matrix Ti is stored in the data storage unit 40, the transformation matrix Ti is used as the transformation rule data, and an inverse matrix of the transformation matrix Ti is used as the inverse transformation rule data.

In this embodiment, in the data storage unit 40, data describing a rule for determining the position and direction of the bone 52 having no correlated ragdoll part 58, based on the position and direction of its parent bone 52 (e.g., data indicative of a relative position and direction relative to the position and direction of its parent bone 52) is stored in advance. In this embodiment, this data describes a rule correlated to a parent-child relationship between the bone 52 and its parent bone 52. This data may describe a rule commonly applicable to the parent-child relationship of the bones 52 or a rule different for each parent-child relationship of the bones 52.

In this embodiment, in the data storage unit 40, motion data describing a manner of changing the posture of the skeleton is stored in advance so as to be correlated to each of a plurality of motions (e.g., walk, run, fall, and so forth). In this embodiment, the motion data includes a combination of the number of a frame among a plurality of pre-set key frames and a posture of the skeleton correlated to the frame number and described by the skeleton data 50 (e.g., the position and direction of each bone 52 in the local coordinate system). In this embodiment, the motion data additionally includes a motion identifier and data indicative of a state (a motion driving state or a full ragdoll state in this embodiment) correlated to that motion. Note that the motion driving state and the full ragdoll state will be described later. In this embodiment, data indicative of the current motion of the player object 22 is also stored.

In this embodiment, in the data storage unit 40, shift condition data describing a condition under which a motion shifts is stored in advance. The shift condition data describes that, e.g., a motion shifts from "walk" to "run" under the condition that an input amount in excess of a predetermined value is input into a controller, that the current motion, whatever it is, shifts to "fall" under the condition that no foot place is available for the player object 22, and so forth. In this embodiment, to the shift condition data is correlated data describing a setting for use in shifting a motion (e.g., data describing the manner of interpolation based on motions before and after a shift, a damping factor (a damping rate), an activating condition, and so forth). Note that the damping factor and the activating condition will be described later.

In this embodiment, the spatial image generation and output unit 46 generates an image showing a picture obtained by viewing from the viewpoint 32 set in the virtual space 20 in the viewing direction (hereinafter referred to as a spatial frame image) at a predetermined interval (e.g., 1/60th of a second), and displays on the display unit 18.

Below, an example of a flow of processing executed for every frame (e.g., at an interval of 1/60th of a second) in the game device 10 in this embodiment under the condition that the motion of the player object 22 does not shift in the previous frame will be described referring to the flowchart shown as an example in FIGS. 6A and 6B. In this example processing, suppose that information relating the current position (not necessarily coincident with the position where the player object 22 is placed) and direction of a player in the ongoing game is set in advance.

Initially, the operation state obtaining unit 42 obtains the operation state of the operating unit 16 (specifically, e.g., the kind of a button pressed and an amount by which the button is pressed) (S101). Then, based on the posture of the skeleton at the time of starting this processing (a motion, a frame number, and so forth), the operation state obtained in the processing at S101, and the current position and direction of the player, the object placement managing unit 44 determines the values of various parameters that are used in describing a change of the player object 22 in the virtual space 20 (S102). Specifically, in the processing at S102, the object placement managing unit 44 determines, e.g., the number of a frame in which the player object 22 is to be set in a posture indicated by the motion data, movement and rotation amounts of the player object 22 in the world coordinate system, the kind of an event having occurred, and the like.

When it is determined in the processing at S102 that any event has occurred, the object placement managing unit 44 executes a processing according to the kind of the event (S103). This processing will be described later in detail.

Thereafter, based on the current motion of the player object 22 and the frame number determined in the processing at S102, the object placement managing unit 44 determines the position and direction of each bone 52 in the local coordinate system (that is, the posture of the skeleton), and places the bone 52 according to the determination (S104).

Specifically, the object placement managing unit 44 places the root bone 52a at a position displaced from the current position of the player by a movement amount determined in the processing at S102 so as to be directed in the direction rotated from the current direction of the player by a rotation amount determined in the processing at S102. In the above, the object placement managing unit 44 may adjust the positions and directions of the respective bones 52 such that the longitudinal direction of the root bone 52a coincides with the normal direction relative to the floor object 24. Then, the object placement managing unit 44 determines the positions and directions of the respective bones 52 in the local coordinate systems according to the data obtained through interpolation based on the posture data correlated to the frame numbers of the key frames immediately before and after the frame having the frame number determined, and then places the remaining bones 52 according to the positions and directions determined in the local coordinate system.

Thereafter, the object placement managing unit 44 obtains the transformation rule data stored in the data storage unit 40, then as to the bone 52 having a correlated ragdoll part 58, determines the position and direction of the ragdoll part 58 correlated to such a bone, based on the placed skeleton and the transformation rule data, and places the respective ragdoll parts 58 according to the determination (S105). Specifically, the object placement managing unit 44 multiplies the value indicative of the position and direction of each bone 52 placed by the transformation matrix Ti to thereby determine the value indicative of the position and direction of the correlated ragdoll part 58.

Further, the object placement managing unit 44 determines a reference position Pb and a reference direction Db, based on the parameter value determined in the processing at S102 (S106). In the above, specifically, the object placement managing unit 44 determines as the reference position Pb, e.g., a position displaced from the position displaced from the current position of the player by the movement amount determined in the processing at S102 further by an offset amount determined based on the kind of the motion determined in the processing at S102, and as the reference direction Db the direction displaced from the direction rotated from the current direction of the player object 22 by the rotation amount determined in the processing at S102 further by an offset amount determined based on the kind of the motion determined in the processing at S102.

Figure 7:
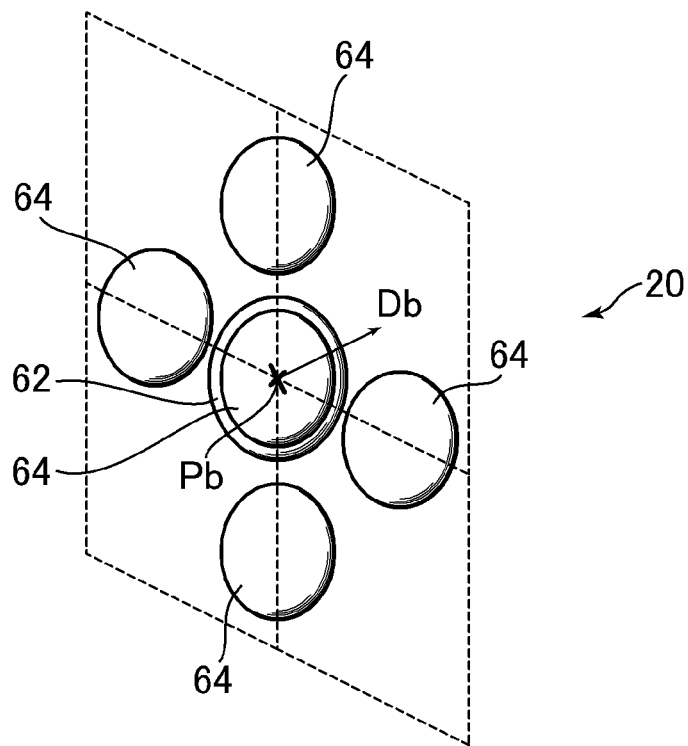
FIG. 7 is a diagram showing one example of a rigid object for collision detection and five proxy objects placed in the virtual space.

Then, the object placement managing unit 44 places a rigid object for collision detection 62 in the virtual space 20 such that a representative position (a position of a representative point) thereof coincides with the reference position Pb and the pre-determined front part thereof is directed in the reference direction Db (S107). In addition, the object placement managing unit 44 places five proxy objects 64 in the virtual space 20 such that the respective representative positions thereof coincide respectively with the reference position Pb and positions displaced up, down, left, and right, respectively, from the reference position Pb (S108). FIG. 7 shows an example in which the rigid object for collision detection 62 and five proxy objects 64 are placed in the virtual space 20. The reference position Pb and the reference direction Db are also shown in FIG. 7. Note that the proxy objects 64 then placed are mere candidates for the proxy object 64 to be used in this processing example. Therefore, one of these proxy objects 64 is determined in a processing to be described later as the proxy object 64 to be used in this processing example. In this embodiment, the five proxy objects 64 are all directed in the reference direction Db. In this embodiment, the rigid object for collision detection 62 and the proxy objects 64 are invisible oval virtual objects placed in the virtual space 20. In this embodiment, the position of the center of gravity of the rigid object for collision detection 62 coincides with that of the proxy object 64 placed at the reference position Pb; the rigid object for collision detection 62 is analogous to the proxy object 64; the rigid object for collision detection 62 is larger than the proxy object 64.

The object placement managing unit 44 executes a physical simulation processing relative to the proxy object 64, the rigid object for collision detection 62, and the ragdoll (S109). As a result, the positions, the directions, and the velocity parameter values (a velocity parameter value is expressed as a 3D vector) of the proxy object 64, the ragdoll, and a virtual object in contact with the ragdoll and/or the rigid object for collision detection 62 may be changed. That is, for example, the position of the proxy object 64 buried in the wall object 26 may be changed to a position outside the wall object 26. Note that the physical simulation processing will be described later in detail.

Thereafter, the object placement managing unit 44 judges a state correlated to the current motion of the player object 22 (S110). In this embodiment, motions such as "walk", "run" are correlated to a motion driving state, while motions such as "fall" to a full ragdoll state.

Figure 8:
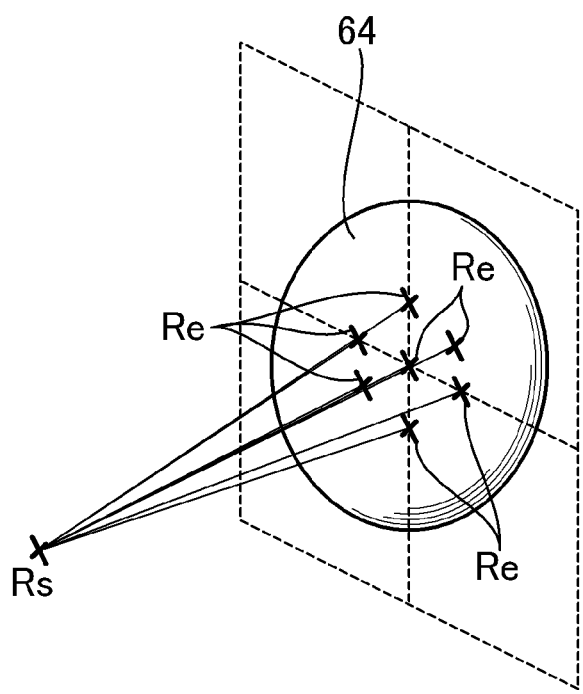
FIG. 8 is a diagram showing one example of seven segments connecting a raycast start point and raycast end points.

Under the condition that it is determined that the state correlated to the current motion of the player object 22 is the motion driving state, the object placement managing unit 44 determines as the proxy object 64 to be used in this processing example, the proxy object 64 having the shortest distance to the reference position Pb of the five proxy objects 64 after execution of the physical simulation processing (S111), and eliminates the other proxy objects 64 from the virtual space 20. Further, as shown in FIG. 8, whether or not there exists another virtual object, such as the wall object 26, on seven segments connecting the raycast start point Rs determined in the previous frame and seven raycast end points Re is judged, in which the seven raycast end points Re are defined at the representative point (e.g., the center of gravity) of the proxy object 64 and respective positions displaced from the representative point forward, backward, left, right, up, and down, respectively, by a predetermined length (S112). Under the condition that the seven segments all intersect another virtual object (S112: Y), the position and direction of the proxy object 64 are changed to those of the proxy object 64 determined in the previous frame (S113). That is, the position and direction of the proxy object 64 return to those of the proxy object 64 determined in the previous frame. That is, the position and direction of the proxy object 64 remain unchanged from those in the previous frame. In this case, the position of the raycast start point Rs in the next frame as well remains unchanged.

Meanwhile, there is a segment that does not intersect another virtual object (S112: N), one of raycast end points Re determined according to a predetermined priority order rule is determined as the raycast start point Rs in the next frame (S114). In this case, the position and direction of the proxy object 64 remain unchanged from those which are determined in the processing at S111.

After the processing at S113 or S114 ends, the object placement managing unit 44 determines the position and direction of the proxy object 64 as the current position and direction of the player in the next frame (S115).

Meanwhile, under the condition that it is judged in the processing at S110 that the state correlated to the current motion of the player object 22 is the full ragdoll state, the position and direction of the root ragdoll part 58a subjected to the physical simulation processing are determined as the current position and direction of the player in the next frame (S116).

After the processing at S115 or S116 ends, the object placement managing unit 44 determines the position and direction of the bone 52 correlated to each ragdoll part 58, based on the ragdoll subjected to the physical simulation processing, and places the bone 52 according to the determination (S117). In the above, the object placement managing unit 44 executes the processing at S117 first relative to the parent bone 52 and then to the child bone 52, beginning with the root bone 52a. Specifically, as to the bone 52 having a correlated ragdoll part 58, the object placement managing unit 44 obtains the inverse transformation rule data stored in the data storage unit 40, and determines the position and direction of such a bone 52, based on the position and direction of the ragdoll part 58 subjected to the physical simulation processing and the inverse transformation rule data. That is, the object placement managing unit 44 multiplies the value indicative of the position and direction of the ragdoll part 58 by an inverse matrix of the transformation matrix Ti, to thereby determine the value indicative of the position and direction of the correlated bone 52.

Meanwhile, as to the bone 52 having no correlated ragdoll part 58, the object placement managing unit 44 determines the position and direction of such a bone 52, based on the data indicating the relative position and direction relative to the position and direction of the parent bone 52 and the position and direction of the parent bone 52, determined in the processing at S117. In this manner, the position and direction of the bone 52 having no correlated ragdoll part 58 are changed based on a change in the position and direction of its parent bone 52.

Thereafter, the object placement managing unit 44 places the player object 22 to be rendered in the virtual space 20 based on the positions and directions of the respective bones 52, determined in the processing at S117 (S118), and then determines the motion of the player object 22 in the next frame, based on the player object 22 after being placed and the operation state of the operating unit 16, obtained in the processing at S101 (S119). Specifically, in the above, the motion in the next frame is determined based on, e.g., information indicating whether or not there is a place to stand on, an inclination angle of the place to stand on, both determined after placement of the player object 22, an impulse value set for each ragdoll, and the shift condition data.

Further, the spatial image generation and output unit 46 generates a spatial frame image showing a picture obtained by viewing from the viewpoint 32 in the viewing direction, and displays on the display unit 18 (S120).

Below, a physical simulation processing at S109 will be described referring to an example in which the barrel object 28 collides against the rigid object for collision detection 62 and the barrel object 28 collides against the proxy object 64, shown in FIG. 9.

Initially, the object placement managing unit 44 specifies a pair of virtual objects that are determined in collision with each other. In this embodiment, as shown in FIG. 9, each virtual object has an invisible judging area (invisible collision detection area 66) set thereon covering, and the object placement managing unit 44 determines a pair of virtual objects of which judging areas (collision detection areas 66) are in contact or overlap with each other as a pair of virtual objects in collision with each other. In the example shown in FIG. 9, it is judged that the proxy object 64 is in collision with the barrel object 28, and that the rigid object for collision detection 62 is in collision with the barrel object 28. Note that in this embodiment, it is set in advance such that collision detection is not executed between the rigid object for collision detection 62 and the proxy object 64.

Figure 9:
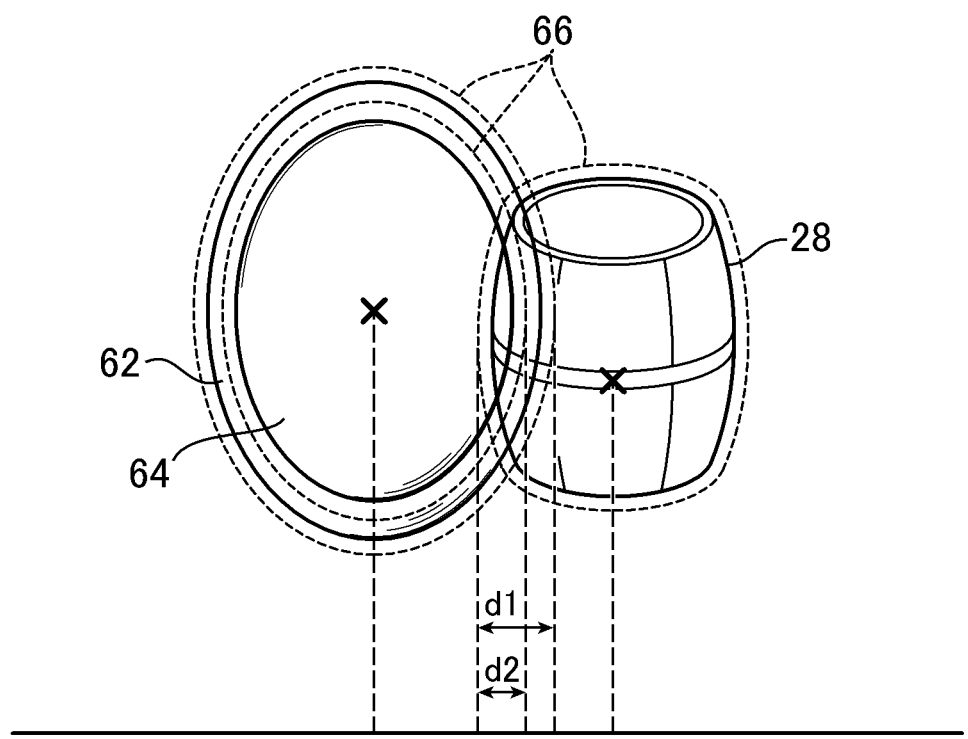
FIG. 9 is a diagram showing an example of a picture in which a barrel object collides against a rigid object for collision detection and the barrel object collides against a proxy object.

Then, the object placement managing unit 44 obtains the mass parameter and velocity parameter values that are set for each of the barrel object 28 and the proxy object 64 shown in FIG. 9, and calculates the amount of change in the velocity parameter value of the proxy object 64, based on the obtained values and an index indicative of an extent by which the proxy object 64 contacts the barrel object 28 (an extent of being buried). Thereafter, the object placement managing unit 44 changes the velocity parameter value by the calculated amount of change, and then, moves the proxy object 64 by a movement amount (e.g., a movement amount obtained by multiplying the changed velocity parameter value by a predetermined number of times) specified based on the changed velocity parameter value. In addition, the object placement managing unit 44 obtains the inertia tensor parameter and angular velocity parameter values that are set for each of the barrel object 28 and the proxy object 64, shown in FIG. 9, and calculates the amount of change in the angular velocity parameter value of the proxy object 64, based on the values obtained and an index indicative of an extent by which the proxy object 64 contacts the barrel object 28 (an extent of being buried). Thereafter, the object placement managing unit 44 changes the angular velocity parameter value by the calculated amount of change, and then, rotates the proxy object 64 by a rotation amount (e.g., a rotation amount obtained by multiplying the changed angular velocity parameter value by a predetermined number of times) specified based on the changed angular velocity parameter value.

Further, the object placement managing unit 44 obtains the mass parameter and velocity parameter values that are set for each of the barrel object 28 and the rigid object for collision detection 62, shown in FIG. 9, and calculates the amount of change in the velocity parameter value of the barrel object 28, based on the values obtained and an index indicative of an extent by which the rigid object for collision detection 62 contacts the barrel object 28 (an extent of being buried). Thereafter, the object placement managing unit 44 changes the velocity parameter value by the calculated amount of change, and then, moves the barrel object 28 by a movement amount (e.g., a movement amount obtained by multiplying the changed velocity parameter value by a predetermined number of times) specified based on the changed velocity parameter value. In addition, the object placement managing unit 44 obtains the inertia tensor parameter and angular velocity parameter values that are set for each of the barrel object 28 and the rigid object for collision detection 62, and calculates the amount of change in the angular velocity parameter value of the barrel object 28, based on the values obtained and an index indicative of an extent by which the rigid object for collision detection 62 contacts the barrel object 28 (an extent of being buried). Thereafter, the object placement managing unit 44 changes the angular velocity parameter value by the calculated amount of change, and then, rotates the barrel object 28 by a rotation amount (e.g., a rotation amount obtained by multiplying the changed angular velocity parameter value by a predetermined number of times) specified based on the changed angular velocity parameter value.

Figure 10:
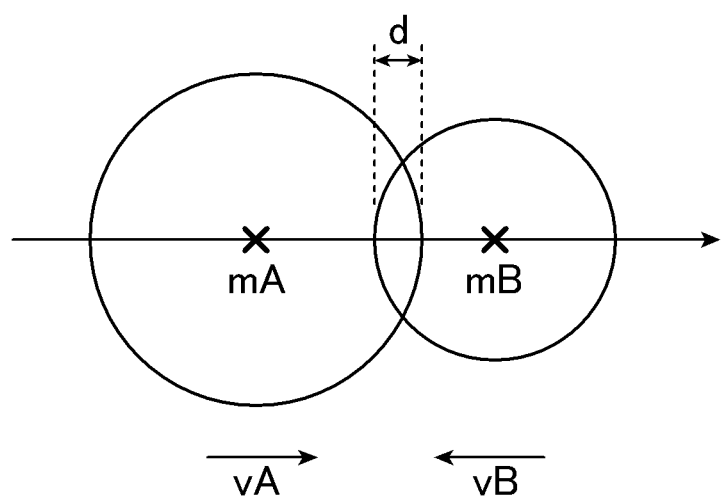
FIG. 10 is a diagram explaining one example of a method for calculating a velocity parameter value by a physics engine.

In this embodiment, the above described calculation of an amount of change is executed using the known physics engine function. Below, referring to FIG. 10, one example of a method for calculating a velocity parameter value by the physics engine will be described. In the description below, assume a case, as shown in FIG. 10, in which a left virtual object (a mass parameter value: mA, a velocity parameter value: vA (positive in the rightward direction)) collides against a right virtual object (a mass parameter value: mB, a velocity parameter value: vB (positive in the rightward direction)). The length d by which the virtual objects overlap with each other in the direction along the straight line connecting the centers of gravity of the virtual objects is used as an index indicative of an extent of contact between the virtual objects (an extent of being buried).

The post-collision velocity vA' of the left virtual object is calculated as $vA'=vA-(mB/(mA+mB))\times(alpha\times(vA-vB)+beta\times d)$, and the post-collision velocity vB' of the right virtual object is calculated as $vB'=vB+(mA/(mA+mB))\times(alpha\times(vA-vB)+beta\times d)$, wherein alpha and beta are predetermined adjustment values.

As described above, according to the physics engine, the amounts of change in the velocity parameter values of the virtual objects in collision are determined based on the ratio of the mass parameter values (the ratio of the mass parameter value of a collision partner relative to the sum of the mass parameter values), the relative velocity, the extent of contact between the virtual objects (the extent of being buried), and so forth. Similarly, according to the physics engine, the amounts of change in the angular velocity parameter values of the respective virtual objects in collision are determined based on the inertia tensor values of the respective virtual objects, the relative angular velocity, the extent of contact between the virtual objects (an extent of being buried), and so forth.

As the extent of contact between the virtual objects (an extent of being buried) in FIG. 9, e.g., the length by which the judging areas (the collision detection areas 66) overlap with each other in the direction along the straight line connecting the projected points of the centers of gravity of the virtual objects when the virtual objects are projected onto a predetermined projection surface may be usable. In this embodiment, the longer the length is, the larger the above described amount of change becomes. For example, in the physical simulation processing applied to a collision between the rigid object for collision detection 62 and the barrel object 28, the length d1 shown in FIG. 9 is used, while in the physical simulation processing applied to a collision between the proxy object 64 and the barrel object 28, the length d2 shown in FIG. 9 is used.

In this embodiment, mass parameter and inertia tensor parameter values that are reasonable to be set for the player object 22 in view of the relationship with another virtual object in a game are set for the rigid object for collision detection 62. Specifically, for example, values are set such that the mass ratio and the inertia tensor ratio between the player object 22 and another virtual object are compatible with those between the player and another object in a game. Meanwhile, values sufficiently larger than those of the mass parameter and the inertia tensor parameter that are reasonable to be set for the player object 22 in view of the relationship with another virtual object in a game are set as the values of the mass parameter and the inertia tensor parameter of the proxy object 64.

In this embodiment, the mass parameter and inertia tensor parameter values to be set for the proxy object 64 are determined based on the attribute of a collision partner virtual object. In this embodiment, e.g., larger values of the mass parameter and the inertia tensor parameter of a collision partner virtual object lead to larger values of the mass parameter and the inertia tensor parameter of the proxy object 64. For example, values in proportion to the values of the mass parameter and the inertia tensor parameter that are set for a collision partner virtual object are set as the values of the mass parameter and the inertia tensor parameter for the proxy object 64. Further, e.g., the mass parameter and inertia tensor parameter values to be set for the proxy object 64 may be determined according to the kind of the collision partner virtual object (e.g., whether the virtual object is the wall object 26 or the barrel object 28, and so forth).

In this embodiment, a parameter value correlated to the player object 22 that is a base for calculation of a change in the physical quantity (velocity or the like) of a collision partner virtual object (the mass parameter and inertia tensor parameter values set for the rigid object for collision detection 62 here) differs from a parameter value correlated to the player object 22 that is a base for calculation of a change in the physical quantity (velocity or the like) of the player object 22 (the mass parameter and inertia tensor parameter values set for the proxy object 64 here). Therefore, by setting a parameter value such that a calculated result by the physics engine does not become unstable due to influence of a round error or the like, it is possible to stabilize a calculated result by the physics engine. Therefore, it is possible to reduce possibility of lessening reality in expression of a collision.

Further, in this embodiment, as the rigid object for collision detection 62 is set larger than the proxy object 64, it can happen that a collision partner virtual object collides against the rigid object for collision detection 62 but not the proxy object 64. Further, as mass parameter and inertia tensor parameter values that are reasonable to be set for the player object 22 in view of the relationship with another virtual object in a game are set for the rigid object for collision detection 62, it is expected that a collision partner virtual object moving can be expressed appropriately (e.g., when expressing a virtual object being blown off). Meanwhile, as values sufficiently larger than the mass parameter and inertia tensor parameter values that are reasonable (e.g., values in proportion to the values of the mass parameter and inertia tensor parameter set for the collision partner virtual object) are set as the mass parameter and inertia tensor parameter values of the proxy object 64, it is expected that, under the condition that it is judged that a virtual object having large values for the mass parameter and inertia tensor parameter (e.g., the wall object 26) collides against the proxy object 64, the proxy object 64 stops sharply free from influence of a round error.

In this embodiment, as it is possible to set mass parameter and inertia tensor parameter values for the proxy object 64 that are in conformity with the attribute of a collision partner virtual object, wider variation can be ensured in setting a parameter value, and accordingly, wider variation can be ensured also in expression of a picture in which virtual objects collide against each other in the virtual space 20.

In this embodiment, of a plurality of candidate proxy objects 64, the proxy object 64 having the shortest distance to the reference position Pb is determined in the processing at S111 as the proxy object 64 to be used in this processing example. This makes it possible to move the player object 22 toward a position as intended, and also to reduce the possibility of unrealistic expression of an image, such as the player object 22 being caught by the wall object 26 having fine concaves and convexes formed thereon, the player object 22 being blown off unexpectedly large due to a small step formed on the floor object 24, and so forth. Further, as the proxy object 64 does not move when a virtual object exists on a segment that connects each of a predetermined number of points defined on the proxy object 64 determined in the processing at S111 and the point defined on the proxy object 64 in the previous frame, it is possible to reduce the possibility of the proxy object 64 passing through the virtual object.

In this embodiment, the object placement managing unit 44 can further change the position and direction of a virtual object, based on a parameter value set for each virtual object indicative of an extent of influence of wind, and a wind velocity parameter value correlated to the position where the virtual object is placed.

Note that, basically, a physical simulation processing similar to the above described is executed with respect to a collision between the ragdoll part 58 and another virtual object, though there may be a difference due to a restriction condition by the joint 60 or the like. In this embodiment, the value of a movement type of each ragdoll part 58 is determined depending on the kind of a motion. Specifically, the value of a movement type may indicate, e.g., a key frame, a position control, a velocity control, joint control, position control (one way), velocity control (one way), joint control (one way), and so forth. The ragdoll part 58 having a movement type value indicative of a key frame does not change its position as a result of the physical simulation processing even after collision with another virtual object. The ragdoll part 58 having a movement type value indicative of position control is placed in a position determined based on the combination of the kind of a motion and a frame number, and then subjected to the physical simulation processing. The ragdoll part 58 having a movement type value indicative of velocity control is given a velocity parameter value determined based on the difference between the actual position and the position determined based on the combination of a motion kind and a frame number, and then subjected to the physical simulation processing. The ragdoll part 58 having a movement type value corresponding to "one way" described above is affected by a collision partner but does not affect a collision partner.

For the ragdoll part 58 having a movement type value indicative of joint control, the angle relative to its parent ragdoll part 58, determined based on the combination of a motion kind and a frame number, is set as the angle of the animation joint 60b, and a predetermined physical restriction condition is set for the physical joint 60a. Then, after thus setting made to the joint 60, the physical simulation processing is executed. Note that in the physical simulation processing, the angle of the animation joint 60b remains unchanged, while the angle of the physical joint 60a is changeable within a range that satisfies the physical restriction condition. In this embodiment, a result of the physical simulation processing applied to the animation joint 60b and that to the physical joint 60a are mixed at a ratio according to a strain parameter value set for the joint 60 (e.g., for the strain parameter value 100%, the proportion of the animation joint 60b is 100%, and for the strain parameter value 0%, the proportion of the physical joint 60a is 100%), and the result of the mixture is considered as the final result of the physical simulation processing.

As described above with reference to the processing at S107, in this embodiment, the ragdoll part 58 subjected to the physical simulation processing is transformed into the correlated bone 52, according to the inverse transformation rule data. Meanwhile, as to some bones 52 having no correlated ragdoll part 58, the position and direction of such a bone 52 are determined based on the position and direction of its parent bone 52. That is, in this embodiment, the total number of the ragdoll parts 58 to be subjected to the physical simulation processing is smaller than that of all bones 52. Thus, in this embodiment, a calculation load in the physical simulation processing at S109 executed in the game device 10 can be reduced, compared to a case in which all bones have correlated ragdoll parts 58.

Further, when, e.g., the motion shifts in the processing at S119, the position and direction of the player object 22 may be determined according to the setting indicated by the data stored in the data storage unit 40. Specifically, for example, the position of the player object 22 to be rendered may be determined, based on a result of interpolation based on a result of the processing at S118 applied to the motion before the shift and that after the shift.

In this embodiment, when the motion shifts, the processing at S101 to S120 is modified according to the setting indicated by the data correlated to the shift condition data. For example, an interpolation is executed over some frames, based on a result of the processing applied to the motion before the shift and that after the shift at a ratio determined according to the setting indicated by the data correlated to the shift condition data, and the obtained interpolated result is considered as a final processing result. Note that in this embodiment, over some frames, the percentage of the processing result with the motion before the shift becomes smaller, while that after the shift becomes larger.

In this embodiment, it is possible that a virtual object that has been in the motion driving state up to the previous frame shifts to be in the full ragdoll state. In this case, in this embodiment, the object placement managing unit 44 executes the physical simulation processing in the full ragdoll state, using a velocity parameter value that is a result of processing executed in the motion driving state. In the above, in this embodiment, under the condition that the above described activating condition correlated to a motion shift is satisfied (e.g., under the condition that a component of the velocity parameter value, the component being in the vertically upward direction set for the virtual space 20 is equal to or larger than a predetermined value), a component of the velocity parameter value after the physical simulation processing in the full ragdoll state, the component being in the vertically upward direction set in advance for the virtual space 20, is multiplied by a value of the above describing damping factor (e.g., the value that is set is any real value between 0 and 1) correlated to a motion shift, to thereby determine the final velocity parameter value. With the above, the direction of the vector indicative of the final velocity parameter value is displaced to be directed more vertically downward relative to the direction of the vector indicative of the velocity parameter value before the multiplication of the damping factor value. For example, under the condition that the velocity vector indicative of the velocity parameter is set as being directed from the current position of the player in the frame preceding by two to that in the frame preceding by one, the velocity vector indicative of the velocity parameter is changed to be directed more vertically downward than the direction set. This makes it possible to prevent a situation lack of reality (e.g., the player object 22 is blown up) after shifting to the full ragdoll state.

Figure 11:
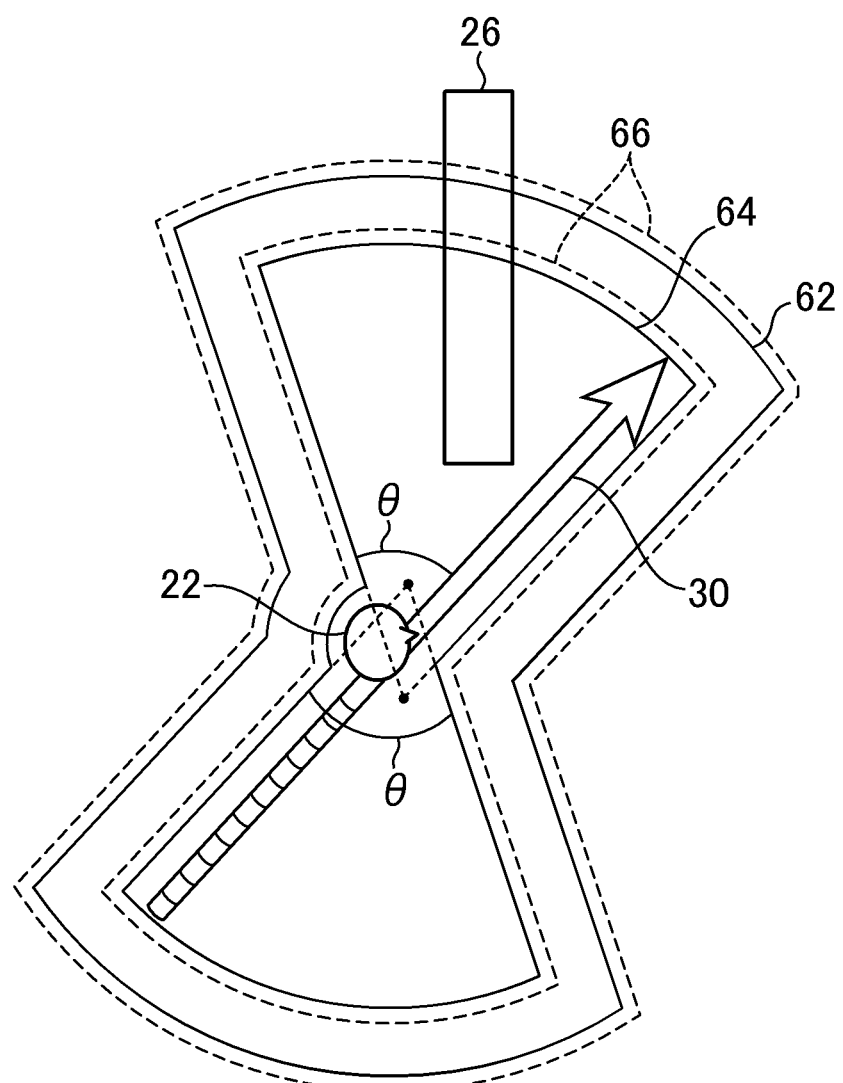
FIG. 11 is a diagram showing one example of the rigid object for collision detection, the proxy object, and so forth, viewed from above a player object.

Below, an example of a processing at S103, which is executed depending on the kind of an event having occurred, will be described referring to FIG. 11. Suppose here that an event in which, e.g., the player object 22 obtains a spear object 30 occurs. FIG. 11 is a diagram showing one example of a picture obtained by viewing the rigid object for collision detection 62 and the proxy object 64 from above the player object 22 when the event occurs.

As shown in FIG. 11, under the condition that the above described event occurs, the object placement managing unit 44 enlarges the proxy object 64 into a shape that contains both of the player object 22 and the spear object 30, and eliminates the judging area (the collision detection area 66) set on the spear object 30. Then, the object placement managing unit 44 sets the judging area (the collision detection area 66) covering the enlarged proxy object 64 as the judging area (the collision detection area 66) correlated to both of the proxy object 64 and the spear object 30. In this manner, a closed area containing both of the player object 22 and the spear object 30 is set as the judging area (the collision detection area 66) correlated to both of the proxy object 64 and the spear object 30. Further, in this embodiment, as shown in FIG. 11, the shapes of the rigid object for collision detection 62 and the judging area (the collision detection area 66) covering the rigid object for collision detection 62 are also changed, following the change in the shape of the proxy object 64, so as to contain the changed proxy object 64.

In this embodiment, under the condition that the judging area (the collision detection area 66) covering the proxy object 64 contacts (or overlaps with) the judging area (the collision detection area 66) of another virtual object, it is judged that the proxy object 64 collides against the other virtual object, and under the condition that the judging area (the collision detection area 66) covering the rigid object for collision detection 62 contacts (or overlaps with) the judging area (the collision detection area 66) of another virtual object, it is determined that the rigid object for collision detection 62 collides against the other virtual object. Note that in the above, alternatively, it may be judged that the spear object 30 or the player object 22 collides against the other virtual object, instead of judging that the proxy object 64 or the rigid object for collision detection 62 collides against the other virtual object, under the condition that the judging area (the collision detection area 66) of the proxy object 64 or the rigid object for collision detection 62 contacts (or overlaps with) the judging area (the collision detection area 66) of the other virtual object.

In this manner, in this embodiment, it is possible to arrange such that the collision detection processing is not executed between the player object 22 and the spear object 30 after occurrence of an event in which the player object 22 obtains the spear object 30.

Further, as shown in FIG. 11, the object placement managing unit 44 may set the proxy object 64 having a shape that partially includes a fan-shaped column, and determines the central angle theta of the fan shape of a cross section of the fan-shaped column, based on the angular velocity parameter value set for the player object 22. Specifically, e.g., a value obtained by multiplying the angular velocity parameter value by one frame time interval may be set as the value of the central angle theta of the fan shape. In the example shown in FIG. 22, two fan-shaped columns are shown, and the centers of the respective fan shapes of cross sections of the respective fan-shaped columns are set at positions that are determined based on the positional relationship between the player object 22 and the spear object 30 (e.g., the neighbourhood of the player object 22). As to the fan shapes of cross sections of the respective fan-shaped columns, a segment connecting the center of the fan shape and the tip end of the spear object 30 and a segment obtained by rotating the segment by the rotation angle theta in the inverse direction of the rotation direction of the player object 22 are defined as the respective radii of the respective fan shapes.

In this manner, even when a motion such as, e.g., brandishing an elongate virtual object, such as the spear object 30, should be performed in the virtual space 20 with a virtual object, such as the wall object 26, present on the orbit of the spear object 30 that moves in one frame, as shown in FIG. 11, it is possible to judge that the proxy object 64 collides against the wall object 26 and that the rigid object for collision detection 62 collides against the wall object 26.

Alternatively, the object placement managing unit 44 may set the proxy object 64 having a shape that partially includes a rectangular parallelepiped having a depth corresponding to the distance by which the player object 22 and the spear object 30 move in the virtual space 20 within a predetermined period of time (e.g., a distance of movement in one frame).

Further, the object placement managing unit 44 may gradually enlarge the shape of the proxy object 64 and the judging area (the collision detection area 66) covering the proxy object 64 after occurrence of an event in which the player object 22 obtains the spear object 30.

Note that the present invention is not limited to the above-described embodiment.

For example, under the condition that the above described activating condition correlated to a motion shift is satisfied, the object placement managing unit 44 may multiply also a velocity component of a velocity parameter value other than the component in the vertically upward direction set for the virtual space 20 by a predetermined value, to thereby reduce the final velocity parameter value, or multiply an angular velocity parameter value by a predetermined value to thereby reduce the final angular velocity parameter value.

Further, in the processing at S112, the judgment as to whether or not there exists another virtual object on a segment may not be executed as to two segments, namely, the segments connecting the raycast start point Rs determined in the previous frame and the raycast end points at respective positions displaced forward and upward, respectively, by a predetermined length relative to the representative point of the proxy object 64.

Further, e.g., the size of the rigid object for collision detection 62 may be changed depending on the kind of a virtual object that is determined as colliding against the rigid object for collision detection 62. For example, under the condition that a collision partner virtual object is a virtual object that is better be blown off more largely, the rigid object for collision detection 62 may be set larger in the size.

In the processing at S111, of the positions of the five proxy objects 64 subjected to the physical simulation processing, the proxy object 64 having a coordinate value in a specific direction (e.g., a coordinate value in the vertical direction) that is closest to a coordinate value in the specific direction (e.g., a coordinate value in the vertical direction) of the reference position Pb may be determined as the proxy object 64 in the above described processing example.

Although the physical simulation processing is executed based on the velocity parameter values of the virtual objects in collision in this embodiment, the physical simulation processing may be executed based on other information relating to a relationship between the moving velocities of two virtual objects, such as, a relative velocity of one virtual object relative to another virtual object, and so forth, instead of the velocity parameter values of the virtual objects in collision.

This embodiment may be applied to an information processing system (e.g., a simulation system, an image processing system, and the like) other than the game device 10. Note that the above described specific numerical values, specific character strings, and specific numerical values in the drawings are only example, and not limiting.

A program according to one embodiment of the present invention may be a program stored in a non-transitory computer readable information storage medium, for causing a computer to function as an information processing system for changing the posture of an object placed in a virtual space, wherein the object of which posture is to be changed includes a plurality of elements for which a connection relationship is defined, the plurality of elements are grouped into a first element of which at least one of the position and the direction is determined based on a relationship with another object placed in the virtual space, and a second element of which at least one of the position and the direction is determined based on a change in at least one of the position and the direction of the first element, and the program may include first element changing instructions to change at least one of the position and the direction of the first element according to a relationship between the value of a parameter correlated to the other object placed in the virtual space and the value of a parameter correlated to the first element, and second element changing instructions to change at least one of the position and the direction of the second element according to a change in at least one of the position and the direction of the first element connected thereto made by the first element changing instructions.

An information storage medium according to one embodiment of the present invention may be a non-transitory computer readable information storage medium storing a program for causing a computer to function as an information processing system for changing the posture of an object placed in a virtual space, wherein the object of which posture is to be changed includes a plurality of elements for which a connection relationship is defined, the plurality of elements are grouped into a first element of which at least one of the position and the direction is determined based on a relationship with another object placed in the virtual space, and a second element of which at least one of the position and the direction is determined based on a change in at least one of the position and the direction of the first element, and the program may include first element changing instructions to change at least one of the position and the direction of the first element according to a relationship between the value of a parameter correlated to the other object placed in the virtual space and the value of a parameter correlated to the first element, and second element changing instructions to change at least one of the position and the direction of the second element according to a change in at least one of the position and the direction of the first element connected thereto made by the first element changing instructions.

An information processing system according to the present invention may be an information processing system for changing the posture of an object placed in a virtual space, wherein the object of which posture is to be changed includes a plurality of elements for which a connection relationship is defined, the plurality of elements are grouped into a first element of which at least one of the position and the direction is determined based on a relationship with another object placed in the virtual space, and a second element of which at least one of the position and the direction is determined based on a change in at least one of the position and the direction of the first element, and the information processing system may comprise a first element changing unit for changing at least one of the position and the direction of the first element according to a relationship between the value of a parameter correlated to the other object placed in the virtual space and the value of a parameter correlated to the first element, and a second element changing unit for changing at least one of the position and the direction of the second element according to a change in at least one of the position and the direction of the first element connected thereto made by the first element changing unit.

An information processing method according to the present invention may be an information processing method for changing the posture of an object placed in a virtual space, wherein the object of which posture is to be changed includes a plurality of elements for which a connection relationship is defined, the plurality of elements are grouped into a first element of which at least one of the position and the direction is determined based on a relationship with another object placed in the virtual space, and a second element of which at least one of the position and the direction is determined based on a change in the position or direction of the first element, and the method may comprise changing at least one of the position and the direction of the first element according to a relationship between the value of a parameter correlated to the other object placed in the virtual space and the value of a parameter correlated to the first element, and changing at least one of the position and the direction of the second element according to a change in at least one of the position and the direction of the first element connected thereto made in changing at least one of the position and the direction of the first element.

It is expected that, when a skeleton model expressing a structure of bones, joints, and so forth of one object (e.g., an object representative of a person) is generated in advance and a simulation is executed by the physics engine relative to an element correlated to each bone, change in the posture of the object can be finely expressed.

In the above, it is expected that a larger number of elements to be simulated by the physics engine leads to a finer expression of a change in the posture of the object. However, it is also expected that a load in information processing is increased.

In one embodiment of the present invention, as the number of the first elements is smaller than that of the elements included in the objects of which posture is to be changed, it is possible to reduce a load in image processing, compared to a case in which at least one of the position and the direction of all elements are determined based on a relationship with other objects. Further, in one embodiment of the present invention, as at least one of the position and the direction of the second element is changed according to a change in at least one of the position and the direction of the first element connected thereto, a change in the posture of the object can be finely expressed. That is, as described above, in one embodiment of the present invention, a change in the posture of an object can be finely expressed, while reducing a load in image processing.

In one embodiment of the present invention, the program may further include rule information obtaining instructions to obtain rule information that describes a transformation rule and an inverse transformation rule, in which the transformation rule relates to transformation of the first element into a ragdoll part for which an amount of change in at least one of the position and the direction thereof is determined based on a relationship between the value of a parameter correlated thereto and the value of a parameter correlated to another object placed in the virtual space, and the inverse transformation rule relates to transformation of a ragdoll part into the first element, and the first element changing instructions may include instructions to transform the first element into a correlated ragdoll part according to the transformation rule described by the rule information in changing at least one of the position and the direction of the first element, then change at least one of the position and the direction of the ragdoll part, based on the relationship between the value of the parameter correlated to the ragdoll part and the value of the parameter correlated to the other object placed in the virtual space, and inversely transform the ragdoll part subjected to the change into the correlated first element according to the inverse transformation rule described by the rule information.

In one embodiment of the present invention, the second element changing instructions may include instructions to change at least one of the position and the direction of the second element according to a change in at least one of the position and the direction of the first element connected thereto made by the first element changing instructions, and a rule correlated to a combination of the second element and the first element connected thereto.

In one embodiment of the present invention, the program may further include instructions to image generating instructions to generate an image showing a picture obtained by viewing a virtual space where an object is placed from a viewpoint set in the virtual space.

A program according to one embodiment of the present invention may be a program stored in a non-transitory computer readable information storage medium for causing a computer to function as an information processing system for controlling movement of an object placed in a virtual space, the program including instructions to: determining instructions to determine a reference position that makes a reference in determining a destination of a moving target object and a plurality of candidate positions that are candidates for a destination of the moving target object, based on the current position of the moving target object; candidate position changing instructions to change at least some of the plurality of candidate positions, based on a relationship between the candidate position and the position of another object placed in the virtual space; and moving target object position changing instructions to change the position of the moving target object to a position closest to the reference position of the plurality of candidate positions including some of the candidate positions of which positions are changed by the candidate position changing instructions.

An information storage medium according to the present invention may be a non-transitory computer readable information storage medium storing a program for causing a computer to function as an information processing system for controlling movement of an object placed in a virtual space, the program including instructions to: determining instructions to determine a reference position that makes a reference in determining a destination of a moving target object and a plurality of candidate positions that are candidates for a destination of the moving target object, based on the current position of the moving target object; a candidate position changing instructions to change at least some of the plurality of candidate positions, based on a relationship between the candidate position and the position of another object paced in the virtual space; and moving target object position changing instructions to change the position of the moving target object to a position closest to the reference position of the plurality of candidate positions including some of the candidate positions of which positions are changed by the candidate position changing instructions.

An information processing system according to the present invention may be an information processing system for controlling movement of an object placed in a virtual space, comprising a determining unit for determining a reference position that makes a reference in determining a destination of a moving target object and a plurality of candidate positions that are candidates for a destination of the moving target object, based on the current position of the moving target object; a candidate position changing unit for changing at least some of the plurality of candidate positions, based on a relationship between the candidate position and the position of another object paced in the virtual space; and a moving target object position changing unit for changing the position of the moving target object to a position closest to the reference position of the plurality of candidate positions including some of the candidate positions of which positions are changed by the candidate position changing unit.

An information processing method according to the present invention may be an information processing method for controlling movement of an object placed in a virtual space, the method comprising: determining a reference position that makes a reference in determining a destination of a moving target object and a plurality of candidate positions that are candidates for a destination of the moving target object, based on the current position of the moving target object; changing at least some of the plurality of candidate positions, based on a relationship between the candidate position and the position of another object paced in the virtual space; and changing the position of the moving target object to a position closest to the reference position of the plurality of candidate positions including some of the candidate positions of which positions are changed.

There has been known an information processing system capable of moving an object placed in a virtual space according to an amount of input of an operation on a controller or the like by a user.

For example, it may happen that, when a destination position to which to move an object which a user can move is determined based on an input amount of an operation, the object, when being placed as determined, may be buried in another object (e.g., an object representative of a wall) placed in the virtual space. In order to prevent such happening, it is possible to execute a simulation processing by a physics engine relative to an object to move, or a moving target object, that is temporarily placed at a position determined based on an input amount of an operation, and then to determine the position of the moving target object that is specified as a result of the simulation processing as the destination position of the moving target object. That is, for example, under the condition that the position where the moving target object is temporarily placed is in a wall object, a position being pushed back out of the wall may be determined as the position of a destination of the moving target object.

In the above, however, when a user moves the moving target object along an edge of the wall object, the moving target object may likely be caught on the surface of the wall. This may result in an awkward expression of the object moving.

Further, when a position at which a moving target object is temporarily placed is in a small step, it may be possible that a position away from the step farther than expected is determined as a destination of the moving target object. In this case, the moving target object may possibly be blown off when overcoming the small step. This may also result in an awkward expression of the object moving.

In an embodiment of the present invention, as the position of a moving target object is changed to a position of the plurality of candidate positions that is closest to the reference position, it is possible to reduce the possibility of an awkward expression of the object placed and moving in the virtual space in the information processing system.

In an embodiment of the present invention, the program may further include judging instructions to judge whether or not there is another object on a segment connecting each of a plurality of positions that are set using the above mentioned position closest to the reference position as a reference and the position where the moving target object is placed, and by the object position changing instructions, the position of the moving target object to the closest position may be changed when it is judged as to at least one segment that there is no another object on the segment by the judging instructions, and the position of the moving target object may not be changed when otherwise.

In an embodiment of the present invention, the program may further include moving instructions to move the moving target object to a position calculated based on a velocity vector set for the moving target object after the position of the moving target object is changed by the moving target object position changing instructions, and the moving instructions may include instructions to move the moving target object further to a position calculated based on a velocity vector resulting from displacement of the velocity vector set for the moving target object so as to be directed in a direction that is set in advance for the virtual space, when a predetermined condition is satisfied.

In an embodiment of the present invention, the moving instructions may include instructions to move the moving target object further to a position calculated based on a velocity vector resulting from displacement of the velocity vector set for the moving target object so as to be directed in a direction that is set in advance for the virtual space as a vertically downward direction.

In one embodiment of the present invention, the program may further include image generating instructions to generate an image showing a picture obtained by viewing the virtual space where the object is placed from a viewpoint set in the virtual space.

A program according to one embodiment of the present invention may be a program stored in a non-transitory computer readable information storage medium, for causing a computer to function as an information processing system for judging whether or not an object placed in a virtual space is in contact with another object, the program including: a judging instructions to judge that a judging target object is in contact with another object under the condition that a judging area set in the virtual space so as to be correlated to the judging target object has a predetermined positional relationship with a judging area set in the virtual space so as to be correlated to the other object, and a judging area changing instructions to change, upon occurrence of a predetermined event, the judging area set in the virtual space so as to be correlated to a first object into a single judging area correlated to the first object and a second object different from the first object.

An information storage medium according to the present invention may be a non-transitory computer readable information storage medium storing a program for causing a computer to function as an information processing system for judging whether or not an object placed in a virtual space is in contact with another object, the program including: a judging instructions to judge that a judging target object is in contact with another object under the condition that a judging area set in the virtual space so as to be correlated to the judging target object has a predetermined positional relationship with a judging area set in the virtual space so as to be correlated to the other object, and a judging area changing instructions to change, upon occurrence of a predetermined event, the judging area set in the virtual space so as to be correlated to a first object into a single judging area correlated to the first object and a second object different from the first object.

An information processing system according to the present invention may be an information processing system for judging whether or not an object placed in a virtual space is in contact with another object, comprising a judging unit for judging that a determining object is in contact with another object when a judging area set in the virtual space so as to be correlated to the judging target object has a predetermined positional relationship with a judging area set in the virtual space so as to be correlated to the other object, and a judging area changing unit for changing, upon occurrence of a predetermined event, the judging area set in the virtual space so as to be correlated to a first object into a single judging area correlated to the first object and a second object different from the first object.

An information processing method according to the present invention may be an information processing method for judging whether or not an object placed in a virtual space is in contact with another object, comprising: judging that a judging target object is in contact with another object when a judging area set in the virtual space so as to be correlated to the judging target object has a predetermined positional relationship with a judging area set in the virtual space so as to be correlated to the other object, and changing, upon occurrence of a predetermined event, the judging area set in the virtual space so as to be correlated to a first object into a single judging area correlated to the first object and a second object different from the first object.

As to a pair of objects placed in a virtual space of which judging areas are in contact (or overlap) with each other, it is possible to express movement of the objects placed in the virtual space by simulating a collision between the pair of objects, using a physics engine.

In the above, however, when expressing a situation in which two objects (the character object and the item in the example below) are moving as if the two objects were a single object, such as a situation in a computer game in which a character object having an item is moving, these two objects are judged as being in collision, and thus, possibly tried to be separated from each other in the simulation using the physics engine. To avoid the above, desirably, contact judgment is not executed as to two objects that are moving as one (e.g., contact judgment is not executed between a character object and the item).

Further, it is possible that setting a single judging area not only for two objects that are moving as one, but also for two or more objects which no longer require contact judgement to be made as a result of occurrence of some event can reduce a processing load in contact judgement between objects placed in the virtual space.

In one embodiment of the present invention, as the judging area set in the virtual space so as to be correlated to the first object is changed into a single judging area correlated to a combination of the first object and a second object upon occurrence of a predetermined event, it is possible to reduce a processing load in executing contact judgement relative to objects placed in the virtual space.

In one embodiment of the present invention, the judging instructions may include instructions to judge that at least one of the first and second objects is in contact with the other object under the condition that the judging area changed by the judging area changing instructions has a predetermined positional relationship with a judging area correlated to another object.

In one embodiment of the present invention, the judging instructions may include instructions to judge that the determining object is in contact with the other object under the condition that the judging area set in the virtual space so as to be correlated to a judging target object overlaps with the judging area set in the virtual space so as to be correlated to another object.

In one embodiment of the present invention, the judging area changing instructions may include instructions to change the judging area set in the virtual space so as to be correlated to the first object into a single judging area that is a closed area containing the judging area set in the virtual space so as to be correlated to the first object and the judging area set in the virtual space so as to be correlated to the second object.

In one embodiment of the present invention, the judging area changing instructions may include instructions to gradually enlarge the judging area set in the virtual space so as to be correlated to the first object or the judging area set in the virtual space so as to be correlated to the second object after occurrence of a predetermined event such that the judging area becomes a single judging area correlated to both of the first object and the second object.

In one embodiment of the present invention, at least one of the first and second objects is an object moving in the virtual space, and the judging area changing instructions may instructions to change the judging area set in the virtual space so as to be correlated to the first object into a single judging area that at least partially includes an area having a shape according to at least one of the length by which at least one of the first and second objects moves in the virtual space in a predetermined period of time and the angle by which at least one of the first and second objects rotates in a predetermined period of time.

In one embodiment of the present invention, the program may further include image generating instructions to generate an image showing a picture obtained by viewing a virtual space where the first and second objects are placed from a viewpoint set in the virtual space.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A non-transitory computer readable information storage medium storing a program for causing a computer to function as an information processing system for simulating a collision between objects placed in a virtual space, the program including:

first control instructions, the first control instructions being instructions to change at least one of a position and a direction of a first object according to a positional relationship between a first area for judging and a second area for judging; and second control instructions, the second control instructions being instructions to change at least one of a position and a direction of a second object according to a positional relationship between a third area for judging and the second area for judging; wherein the first area for judging surrounds a first representation, the first representation representing a rigid object of the first object, the second area for judging surrounds a second representation, the second representation representing the second object, the third area for judging surrounds a third representation, the third representation representing a proxy object of the first object, the proxy object is different than the rigid object; and wherein the first control instructions include instructions to change at least one of the position and the direction of the first object by an amount that is determined, in changing at least one of the position and direction of the first object, based on moving velocity information relating to a relationship between a moving velocity of the first object and a moving velocity of the second object when the first object collides against the second object, passive physical quantity information having at least one of a value correlated to the mass and a value correlated to the inertia moment of the first object, and partner physical quantity information indicating physical quantity correlated to at least one of the mass and the inertia moment of the second object, and the second control instructions include instructions to change at least one of the position and the direction of the second object by an amount that is determined based on active physical quantity information having at least one of a value correlated to the mass and a value correlated to the inertia moment of the first object and differing from the value of the passive physical quantity information, and the partner physical quantity information.

2. The medium according to claim 1, wherein the first control instructions include instructions to change at least one of the position and the direction of the first object under a condition that at least a part of the first area for judging overlaps with at least a part of the second area for judging, and the second control instructions include instructions to change at least one of the position and the direction of the second object under a condition that at least a part of the third area for judging overlaps with at least a part of the second area for judging.

3. A medium according to claim 1, wherein the program further includes setting instructions to set a value of the active physical quantity information according to attribute of the second object, and the second control instructions include instructions to change at least one of the position and the direction of the second object by an amount that is determined based on the active physical quantity information of which value is set by the setting instructions.

4. The medium according to claim 1, wherein the program further includes image generating instructions to generate an image showing a picture obtained by viewing the virtual space where the first object and the second object are placed from a viewpoint set in the virtual space.

5. An apparatus comprising a microprocessor operating under the control of a computer program for causing a computer to function as an information processing system for simulating a collision between objects placed in a virtual space, the program including:

first control instructions, the first control instructions being instructions to change at least one of a position and a direction of a first object according to a positional relationship between a first area for judging and a second area for judging; and second control instructions, the second control instructions being instructions to change at least one of a position and a direction of a second object according to a positional relationship between a third area for judging and the second area for judging; wherein the first area for judging surrounds a first representation, the first representation representing a rigid object of the first object, the second area for judging surrounds a second representation, the second representation representing the second object, the third area for judging surrounds a third representation, the third representation representing a proxy object of the first object, the proxy object is different than the rigid object; and wherein the first control instructions include instructions to change at least one of the position and the direction of the first object by an amount that is determined, in changing at least one of the position and direction of the first object, based on moving velocity information relating to a relationship between a moving velocity of the first object and a moving velocity of the second object when the first object collides against the second object, passive physical quantity information having at least one of a value correlated to the mass and a value correlated to the inertia moment of the first object, and partner physical quantity information indicating physical quantity correlated to at least one of the mass and the inertia moment of the second object, and the second control instructions include instructions to change at least one of the position and the direction of the second object by an amount that is determined based on active physical quantity information having at least one of a value correlated to the mass and a value correlated to the inertia moment of the first object and differing from the value of the passive physical quantity information, and the partner physical quantity information.

6. An information processing system for assisting expression of a situation in which objects placed in a virtual space collide against each other, comprising:

a first control unit configured to change at least one of a position and a direction of a first object according to a positional relationship between a first area for judging and a second area for judging; and a second control unit configured to change at least one of a position and a direction of a second object according to a positional relationship between a third area for judging and the second area for judging; wherein the first area for judging surrounds a first representation, the first representation representing a rigid object of the first object, the second area for judging surrounds a second representation, the second representation representing the second object, the third area for judging surrounds a third representation, the third representation representing a proxy object of the first object, the proxy object is different than the rigid object; and wherein the first control unit is further configured to change at least one of the position and the direction of the first object by an amount that is determined, in changing at least one of the position and direction of the first object, based on moving velocity information relating to a relationship between a moving velocity of the first object and a moving velocity of the second object when the first object collides against the second object, passive physical quantity information having at least one of a value correlated to the mass and a value correlated to the inertia moment of the first object, and partner physical quantity information indicating physical quantity correlated to at least one of the mass and the inertia moment of the second object, and the second control unit is further configured to change at least one of the position and the direction of the second object by an amount that is determined based on active physical quantity information having at least one of a value correlated to the mass and a value correlated to the inertia moment of the first object and differing from the value of the passive physical quantity information, and the partner physical quantity information.

7. An information processing method for simulating a collision between objects placed in a virtual space collide against each other, the method comprising:
- controlling to change at least one of a position and a direction of a first object according to a positional relationship between a first area for judging and a second area for judging; and
- controlling to change at least one of a position and a direction of a second object according to a positional relationship between a third area for judging and the second area for judging; wherein
- the first area for judging surrounds a first representation, the first representation representing a rigid object of the first object,
- the second area for judging surrounds a second representation, the second representation representing the second object,
- the third area for judging surrounds a third representation, the third representation representing a proxy object of the first object,
- the proxy object is different than the rigid object; and
- controlling to change at least one of the position and the direction of the first object by an amount that is determined, in changing at least one of the position and direction of the first object, based on moving velocity information relating to a relationship between a moving velocity of the first object and a moving velocity of the second object when the first object collides against the second object,
- passive physical quantity information having at least one of a value correlated to the mass and a value correlated to the inertia moment of the first object, and partner physical quantity information indicating physical quantity correlated to at least one of the mass and the inertia moment of the second object, and
- controlling to change at least one of the position and the direction of the second object by an amount that is determined based on active physical quantity information having at least one of a value correlated to the mass and a value correlated to the inertia moment of the first object and differing from the value of the passive physical quantity information, and the partner physical quantity information.

* * * * *